United States Patent
Poirier et al.

(10) Patent No.: US 7,064,624 B2
(45) Date of Patent: Jun. 20, 2006

(54) POWER CONDITIONERS AND PSEUDO ISOLATION FOR A TWO-WIRE PROCESSING NETWORK

(75) Inventors: Denis M. Poirier, Cleveland Hts., OH (US); Steffen Graber, Ludwigshafen (DE)

(73) Assignee: Pepperl+Fuchs, Inc., Twinsburg, OH (US)

( * ) Notice: Subject to any disclaimer, the term of this patent is extended or adjusted under 35 U.S.C. 154(b) by 0 days.

(21) Appl. No.: 10/504,117

(22) PCT Filed: Jan. 20, 2004

(86) PCT No.: PCT/US2004/001600

§ 371 (c)(1),
(2), (4) Date: Aug. 9, 2004

(87) PCT Pub. No.: WO2004/065559

PCT Pub. Date: Aug. 5, 2004

(65) Prior Publication Data

US 2005/0140460 A1    Jun. 30, 2005

Related U.S. Application Data

(60) Provisional application No. 60/319,886, filed on Jan. 20, 2003.

(51) Int. Cl.
*H04B 3/32* (2006.01)
*H03H 7/06* (2006.01)
(52) U.S. Cl. .................................. 333/12; 333/172
(58) Field of Classification Search .............. 333/12, 333/22 R, 172, 177, 178, 179, 181

See application file for complete search history.

(56) References Cited

U.S. PATENT DOCUMENTS

| 3,972,020 A | * | 7/1976 | Carroll et al. ............... 367/45 |
| 5,083,101 A | | 1/1992 | Frederick |
| 5,313,176 A | | 5/1994 | Upadhyay |

(Continued)

FOREIGN PATENT DOCUMENTS

EP    0 469 255 A    2/1992

(Continued)

OTHER PUBLICATIONS

PCT International Search Report, mailed Nov. 19, 2004; Int'l Appl. No. PCT/US04/01600.

(Continued)

*Primary Examiner*—Dean Takaoka
(74) *Attorney, Agent, or Firm*—Fay, Sharpe, Fagan, Minnich & McKee, LLP

(57) ABSTRACT

An isolator, such as a common-mode-reactor, and power-conditioner network is utilized to provide at least one of adequate segment impedance, cross-talk or adequate high-frequency-interference attenuation on, or between, participating segments. The participating segments comprise adequate power conditioning, and are supplied by an isolated or non-isolated common power supply. At least one of the segments may have one of two poles in resistive and/or capacitive and/or inductive contact to ground, as well as having one of the segments, in resistive and/or capacitive and/or inductive contact to another of one of two poles of other segments. The power-condition and common-mode inductor provide adequate two-wire Fieldbus communication impedance, by use of series passive reactance, where each reactor may comprise one, or more, separate reactors, intersected and/or shunted by one, or more, n-order passive dampers, having damping characteristics adequate to curtail provoked signal bias and/or jitter and/or distortion and/or resonance using a minimal amount of series-resistance.

23 Claims, 11 Drawing Sheets

U.S. PATENT DOCUMENTS

| | | | |
|---|---|---|---|
| 5,321,373 A | 6/1994 | Shusterman et al. | |
| 5,825,259 A | 10/1998 | Harpham | |
| 6,552,630 B1 * | 4/2003 | Chueh et al. | 333/172 |
| 2003/0112961 A1 | 6/2003 | Wang | |

FOREIGN PATENT DOCUMENTS

| | | |
|---|---|---|
| JP | 2 004040444 A | 2/2004 |
| WO | WO 2004/073373 A2 | 9/2004 |

OTHER PUBLICATIONS

Phinney, Tom, "Mopping Up From Bus Wars"; *World Bus Journal*, fieldbus.isa.org, 2 pages, undated.

"Common Mode Rejection", Voltechnotes, VPN 104-108/2; 2001 Voltech Instruments, 10 pages.

Likely, Chris; "Achieving EMC for Dc—Dc Convertors"; Retrieved from the Internet: URL: http://www.ce-mag.com/archive/02/11/likely.html; retrieved Dec. 23, 2005.

* cited by examiner

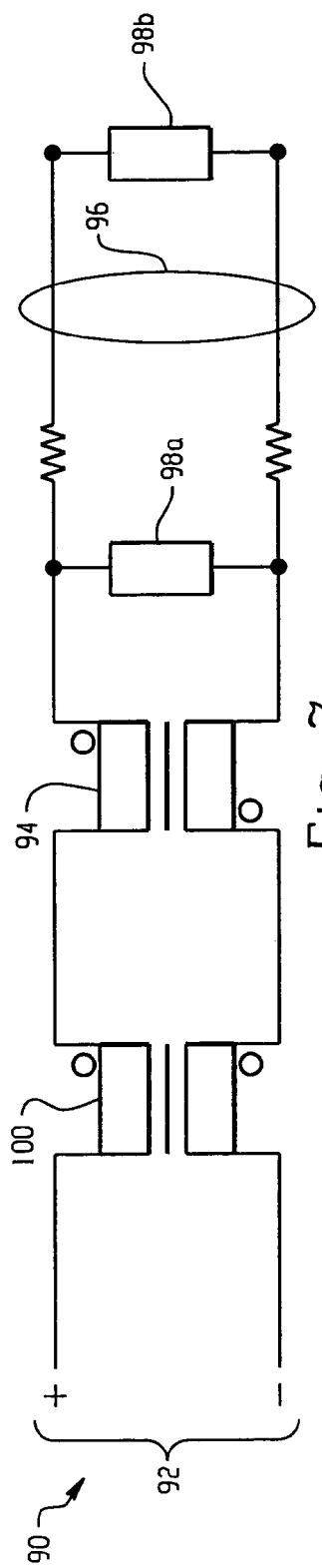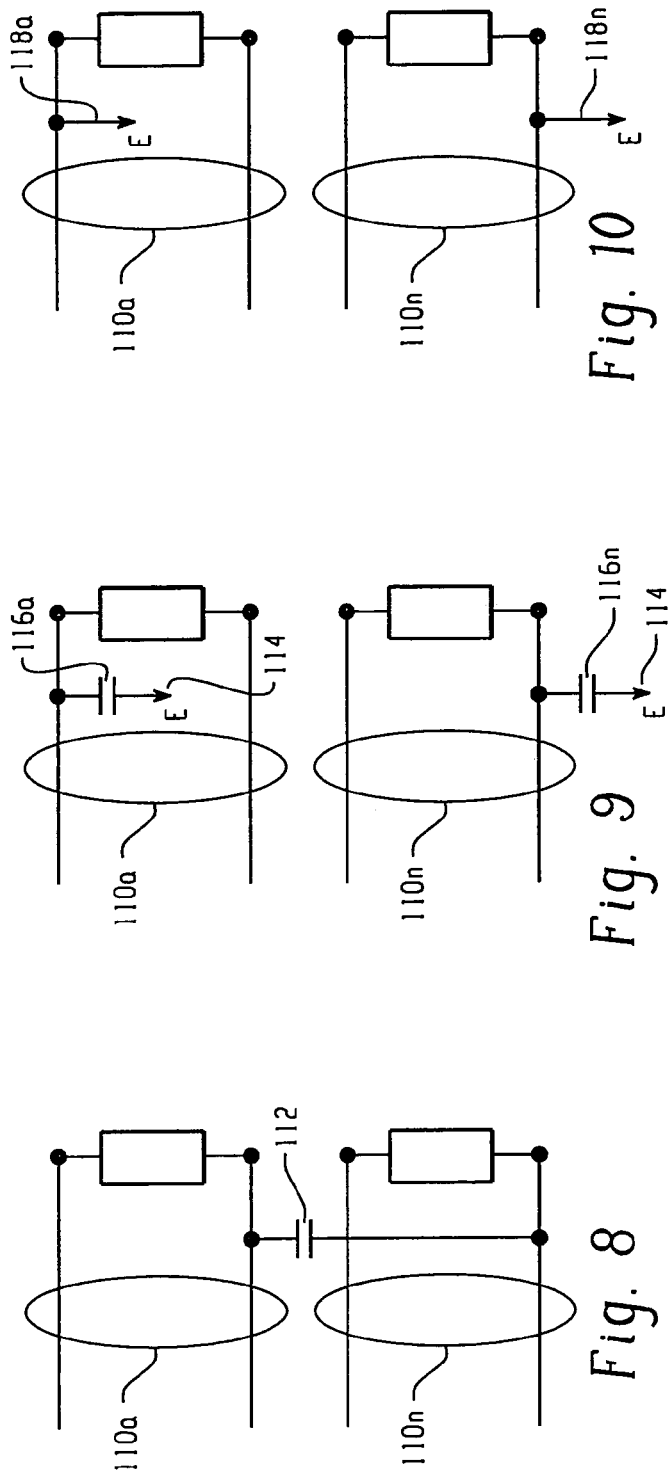
Fig. 7
Fig. 8
Fig. 9
Fig. 10

POWER CONDITIONERS AND PSEUDO ISOLATION FOR A TWO-WIRE PROCESSING NETWORK

This application claims priority to U.S. Provisional Application and Ser. No. 60/319,886 filed on Jan. 20, 2003.

BACKGROUND

The present application is directed to a two-wire processing network which employs a two-wire process control loop to connect field mounted two-wire processing devices to a process controller. More particularly, the present application relates to the provision of passive power conditioning and pseudo isolation to such networks.

Two-wire processing networks have been developed as a way to reduce the wiring required due to the placement of processing devices in the field, remote from the controller.

One class of process devices are process measurement devices which include process variable transmitters, used to measure a process variable such as pressure, temperature, flow or position and communicate the measured variable to a process controller. Another type of process device is an actuator, such as a valve or motor controller or the like. Generally, process control is accomplished using a combination of transmitters, actuators, and a process controller that communicate across a process control network. Both types of process devices interact with the physical process through process interface elements, which are devices that relate electrical signals to physical process conditions, and include devices such as sensors, limit switches, valve controllers, heaters, motor controllers, and a number of other devices.

The process controller may, among other components and systems, be a microcomputer or other intelligent device located in a control room distant from the monitored processes. The process controller can receive process information from one or more process measurement devices and apply a suitable control signal to one or more process control devices to control the process.

The two-wire devices receive power from the process control network, and communicate over the process control network in a manner that is generally unaffected by the provision of power to the process device. Techniques for communicating over two-wires include 4–20 mA signaling in accordance with one of a number of protocols, including those known as the Foundation Fieldbus Protocol and the Profibus Protocol, among others.

Although two-wire process control systems permit wiring simplification, such systems only provide a limited amount of electrical power to connected process devices. For example, a process device that communicates in accordance with 4–20 mA signaling is to draw no more than 4 mA, otherwise the device's current consumption could affect the process variable.

An important aspect of the two-wire network is the need to create appropriately conditioned power, therefore two-wire networks incorporate some form of power conditioning. A power conditioner is a circuit that connects between a power supply and the network connecting the process devices and controller to create the impedance needed to allow communication and power to co-exist on the same pair of wires. Power conditioning circuits used in two-wire networks are commonly broken down into two categories, passive power conditioners and active power conditioners. Requirements and characteristics particularly related to Fieldbus power conditioners, as well as other aspects of the Fieldbus networks are provided in a set of identified standards as detailed in the International Fieldbus Standards Series IEC 61158 and 61784, both hereby incorporated by reference in their entirety. Of particular interest as related to power conditioners is the IEC 61158-2, which provides standards for Fieldbus networks used as industrial control systems, including the physical layer specifications.

While active power conditioners are being used in existing systems, the present disclosure is particularly directed to passive power conditioning. Benefits obtainable by a passive power conditioner include the potential for high reliability due to the absence of active components, and the economic advantage of inexpensive passive components.

In accordance with the IEC 61158-2 power conditioner requirements, an ideal passive power conditioner includes a 5 milli-Henry inductor with a 50 ohm resistor placed in series between the power supply and the network. This design, in conjunction with trunk terminators of the Fieldbus network, creates a critically damped circuit with an impedance ranging from 40 to 60 ohms across a frequency ranging from DC through 100 kHz. A problem with this ideal conditioning (damping) circuit is that use of the 50 ohm resistor results in high voltage loss, particularly in high current demand situations. For example, if the bus current demand for a trunk is 300 milli-amps, then the voltage loss across the 50 ohm resistor would be approximately 15 volts. Commonly, two-wire networks are supplied by a 24 volt source, and a process device may require a minimum of 9 volts for operation. Since there would also be voltage drops in the network due to cable resistance, under such conditions either the trunk cable limit would be driven down to an impractical 0 meters, or there would be insufficient voltage for the processing device. Additionally, the voltage loss generated by the 50 ohm resistor would amount to 4½ watts which is generally unacceptable for today's technological solutions. To address this situation, a user may be tempted to remove the resistor. However, this will result in network instability and communication distortion among other problems.

It is also inferred in the standards set forth in IEC 61158-2 (i.e, clause 12, formerly clause 22) that galvanic isolation should be provided for each segment of a Fieldbus network. As used within this discussion, galvanic isolation is to be understood to mean true electrical isolation between components. Such isolation will lower or remove parasitic cable crosstalk, as well as or in addition to maintaining adequate power source impedance at times when one bus conductor in the system may fail to ground. Parasitic crosstalk may also occur when a bus conductor fault, such as described above, occurs on two discretely conditioned segments of the Fieldbus that do not have galvanic isolation from each other. It is to be understood, however, that due to component parasitic influences and the requirement for adequate common mode and/or differential mode noise suppression, ideal galvanic isolation in existing power conditioners may not be completely obtainable. Existing power supply systems are adequate for dealing with in-band frequency influences and frequency influences below the in-band frequency, in view of the recommended network constraints outlined in IEC 61158-2 at clause 12. In situations where redundant topologies exist, segment isolation presents a cost, size and efficiency penalty which progressively increases with an increase in output power. Also, for existing power supplies, frequencies increasing above the in-band frequencies become proportionally problematic, as will be expanded upon below.

Thus, existing Fieldbus and other two-wire networks suffer from various drawbacks. Among these are inefficiencies and limitations of operation, especially at high current demand levels for networks employing active or ideal power conditioners, as well as inefficiencies in attempting to provide isolation between network segments, particularly when frequencies will increase above an in-band frequency range. The following will discuss solutions to the foregoing problems.

SUMMARY

In accordance with one aspect of the present exemplary embodiment, provided is an isolator/power supply network implemented with multi-segment two-wire processing networks. Each power conditioner has a power input side and a processing device side. The isolator/power conditioner network includes a power conditioner located between each segment and the power input side, configured to receive input power. An isolator is located on each segment, between the power input side and the passive reactance network and the passive damping network. This arrangement provides at least one of segment impedance, cross-talk or high frequency interference attenuation.

In another aspect of the present application, the power conditioner is configured to include a passive reactance network configured of one or more passive reactor components within the two-wire network to generate communication impedance for the two-wire process network. A passive damping network is configured of one or more passive damping components in operative connection with the passive reactance network, wherein the passive damping network curtails at least one of the resonance, signal bias, signal jitter, signal distortion or fly-back of the two-wire process network.

BRIEF DESCRIPTION OF THE DRAWINGS

FIG. 7 illustrates a passive power conditioner circuit within a Fieldbus network incorporating a common mode inductor in accordance with the present application;

FIG. 8 emphasizes intersegment capacitive coupling resulting in capacitive unbalance;

FIG. 9 illustrates segment capacitive coupling to ground creating a capacitive unbalance;

FIG. 10 illustrates multiple ground faults creating unbalance segments;

DETAILED DESCRIPTION

In the subsequent discussion, the listed terms will have the following meanings:

"Passive. Components" are resistors, inductors and/or capacitors.

"Significant" is intended to mean a substantial enough value to be detrimental in accordance with a standard and/or technical dictate and/or opinion.

"Adequate" is intended to mean just enough to be effective through to an exact amount.

"Ideal Power Conditioner" is intended to mean a power conditioner comprising series reactance and series resistance.

"Dampers" is intended to mean signal damping circuits which may be comprised of one or more passive components adequately arranged in any particular combination.

Figure 1:
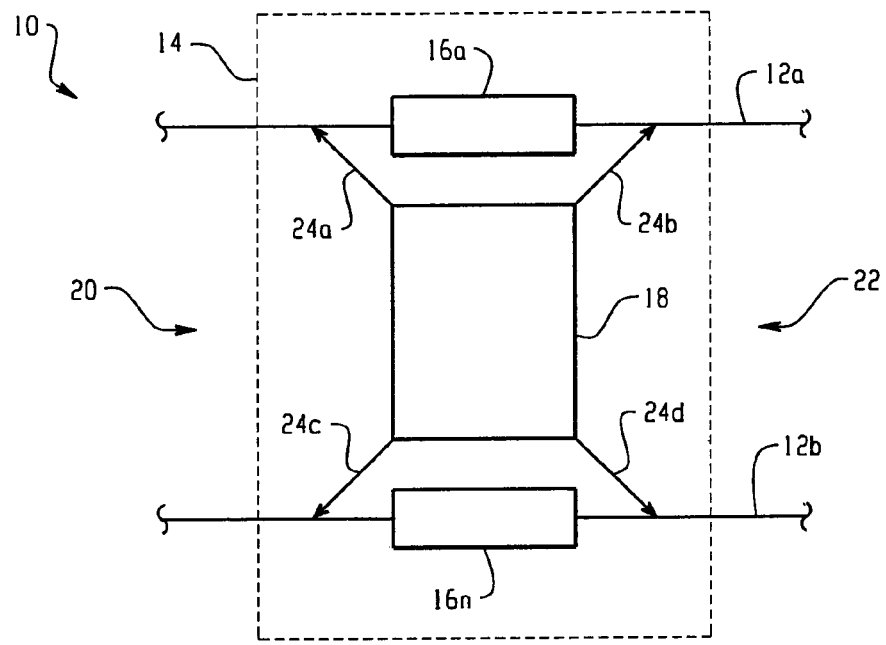
FIG. 1 depicts a first embodiment of a power conditioner circuit which may be used in a Fieldbus network in accordance with concepts with the present application.

Turning attention to FIG. 1, an embodiment of the present application is now described by way of example. Particularly set forth is a portion of a two-wire network 10 such as but not limited to a Fieldbus network having a bus including a first conductor 12a and a second conductor 12b. Connected to bus conductors 12a, 12b is passive power conditioner network 14, which includes passive reactance components 16a to 16n, as well as a passive damping network 18. Power is supplied on power input side 20, via a low impedance power source (not shown), and output signals are generated at output 22 for field process devices (not shown). FIG. 1 illustrates the passive reactances 16a, 16n, which may be inductors, in a symmetrical combination, positioned in series with the incoming low impedance power from power input side 20. The output 22 forms part of or is connected to a terminated network or trunk (not shown). Passive damping network 18 intersects with the passive reactances 16a, 16n. Additionally, passive damping network 18 may comprise (n) order circuits, which work in concert with output components (e.g., the terminator and/or process devices) and/or with the passive reactance components 16a–16n of the passive power conditioner 14.

Connections 24a, 24b, 24c and 24d are intended to show multiple possible connections for placement of passive damping network 18. For example, in one embodiment, connections 24a and 24c are made to the bus conductors 12a and 12b respectively, and connections 24b and 24d are eliminated. Alternatively, passive damping network 18 may be connected to conductors 24b and 24d with 24a and 24c connections not being made. Alternatively, diagonal connections may be made where connections 24a and 24d connect to bus conductors 12a, 12b respectively, with 24b and 24c connections not being made. Still further, connections may be via 24b and 24c, with no connections by 24a and 24d. In another alternative, and dependant on the configuration of passive damping network 18, all connections 24a–24d may be made to bus conductors 12a, 12b.

As shown in FIG. 1, passive reactance components 16a–16n and passive damping network 18 are used in combination to provide a passive power conditioner circuit which does not require a large (i.e., 50 ohm) resistance in series with the inductance, as used in the previously discussed ideal passive power conditioner. By eliminating the use of the high in-series resistance, passive power conditioner 18 is more efficient at high current implementations than previous systems as it eliminates the otherwise occurring voltage loss caused by the (50 ohm) resistance. Additionally, use of the reactance network 16a–16n in combination with passive damping network permits a lower resonant peak than is obtained when the in-series resistance is simply removed.

Figure 2:
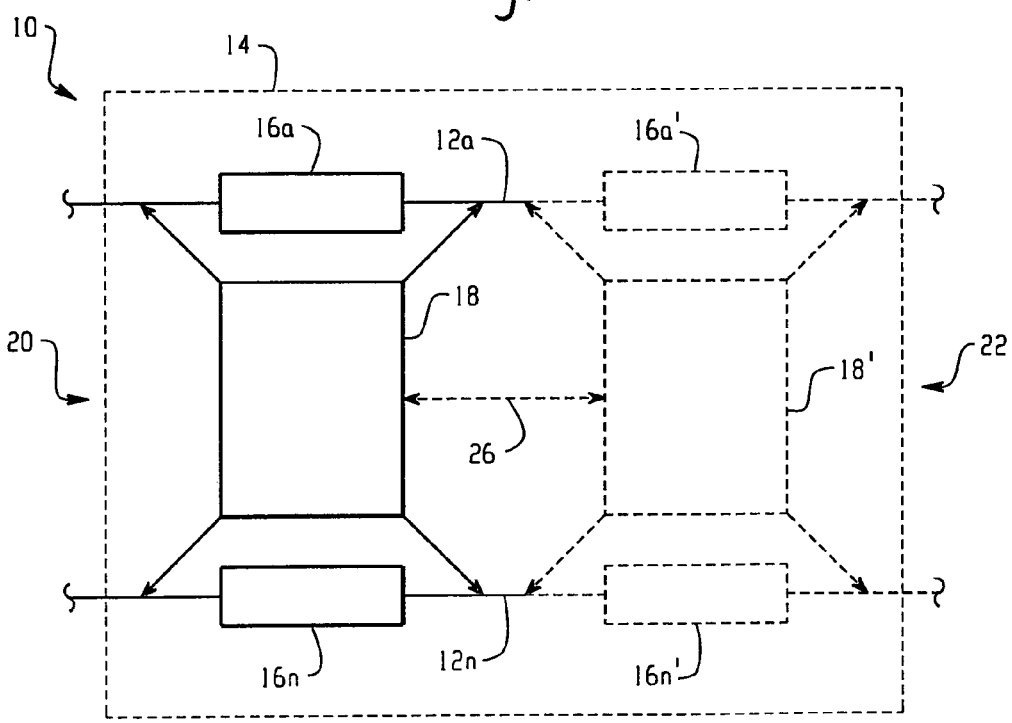
FIG. 2 illustrates the use of a plurality of power conditioner circuits implemented within a segment of a Fieldbus network.

Turning to FIG. 2, illustrated is a power conditioner circuit 14 implemented within a two-wire network 10, similar to FIG. 1. However, a distinction between FIG. 1 and FIG. 2 is that the circuit of FIG. 2 illustrates that additional passive reactances 16a'–16n' and passive damping networks (i.e., 18, 18') may be assembled within a network segment. By this design, the passive damping networks 18, 18' may be located between a network of passive reactance components (i.e., 16a, 16a', 16n, 16n'). It is to be understood that, while a second network of inductors 16a'–16n' and passive damping network 18' are shown, the description is not intended to be read as limiting the design to only two such arrangements, but rather a plurality of these passive damping networks 18' and passive reactances 16a', 16n' may be implemented. It is noted in that the design interconnection 26 may be an optional physical connection, such as a shared component (i.e., transformer, resistor, inductor, etc.) between the passive damping networks 18, 18'.

Figure 3:
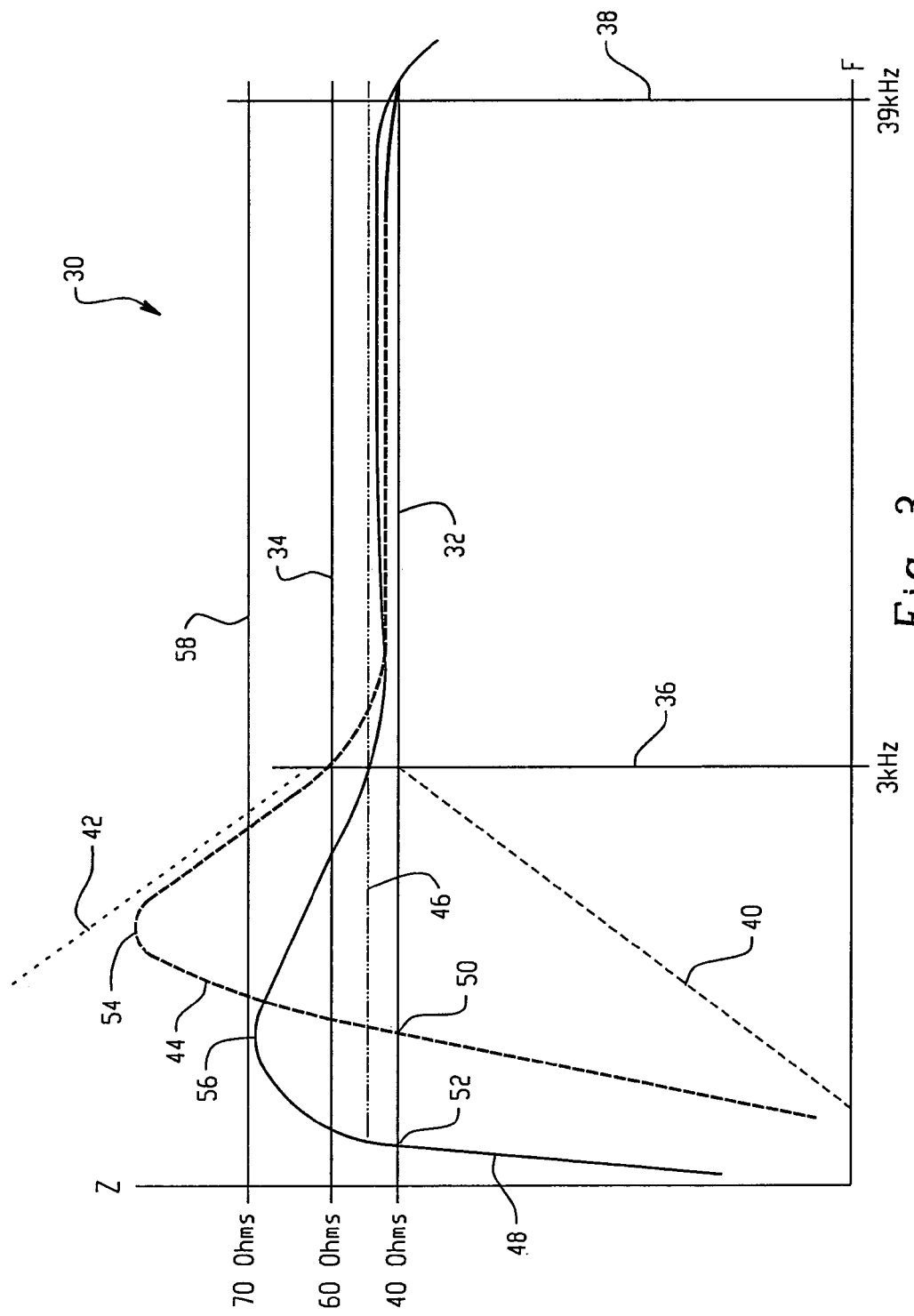
FIG. 3 provides a spectrograph of adequately damped, critically damped and undamped power conditioner networks tested in accordance with IEC 61158-2.

FIG. 3, depicts a spectrograph 30 which sets forth operational requirements (in accordance with IEC 61158) for passive power conditioner circuits, and curves plotted against those requirements. In accordance with IEC 61158, network impedance is to be between 40 ohms (32) to 60 ohms (34), for a frequency range of 3 kHz (36) to 39 kHz (38). When below 3 kHz, a signal is required to be within a slope generated by lines 40 and 42 (which represents a 20 db/per decade slope). Also depicted in this figure are plotted curves for a Fieldbus network using an undamped power conditioner 44, a critically (ideal) damped power conditioner 46, and an adequately damped power conditioner 48, such as one taught in the present application.

According to IEC 61158, signal bias and signal jitter must be maintained within a given set of limits, and as such, the instigation of bias and jitter must be adequately curtailed. It has been determined that inadequate low frequency components of the impedance spectrograph have an effect on the bias and/or jitter where a characteristic given by undamped curve 44, having a crossing point 50, will result in less stable communication than is afforded by the adequately damped curve 48, having a crossing point at point 52, which is of a frequency lower on the spectrum. Additionally, the resonance peak of the curves must also be adequately lowered, where, in this example, the undamped curve 44 has a much higher resonance peak 54 than the resonance peak 56 of the adequately damped curve 48, which at the point of resonance is approximately below 100 ohms 58. Lowering the resonance peak of the curve is valuable as a high resonance peak may undesirably contribute to the bias and/or jitter, as well as signal distortion leading to bias and/or jitter.

The resonance values may also have an effect on trailing bit flyback oscillation or voltage recovery oscillation, where it is understood that a trailing bit flyback oscillation may occur in an instrument which generates data on a bus but does not reset itself back to a 0 volt deviation on the bus. This situation generates a negative pulse on the bus that may create a positive overshoot trailing the end of the signal that other devices on the bus may interpret as a start of a new message. This potential miscommunication is minimized by lowering the resonance portion of a network. Similarly, for a voltage recovery oscillation signal, which occurs when the circuit is attempting to reset itself to the base voltage of 24 volts, the circuit may overshoot from a desired level, creating unexpected and potentially interfering signals. Lowering the resonance portion of the curve acts to diminish the possibility the overshoot signals will be misinterpreted.

It is to be understood that in FIG. 3, the critically damped (i.e., ideal) curve 46 may be established by utilizing the 5 milli-Henry inductor in series with a damping resistor of 50 ohms, where the resultant stability will adequately lower any bias, jitter and/or fly-back, as well as any other disrupting recovery oscillations. However, as previously mentioned, this critically damped circuit has drawbacks of its own, especially in situations of high current usage. As disclosed above and as will be explained in greater detail below, the passive power conditioner of the present application eliminates the use of any significant in-series resistance (e.g., 50 ohms). In an ideal situation, all in-series resistance would be eliminated. However, in a practical application, the presented designs may result in some resistance. Depending on the circuit design, use and components, this resistance may range from approximately 1 ohm to 20 ohms, and in particular embodiments 1 ohm to 1.5 ohms of in-series resistance may exist. The resistance may be parasitic or designed within a component. Recitation of the above values should not be interpreted as limiting the present designs to only these values. Rather, other resistance values may be appropriate dependant upon a particular implementation.

With continuing attention to FIG. 3, the adequately damped curve 48, obtained by the passive power conditioner of the present application, is maintained between 40 ohms (32) to 60 ohms (34) throughout the relevant frequency range of 3 kHz (36) and 39 kHz (38), in accordance with the IEC 61158 standards.

Figure 4:
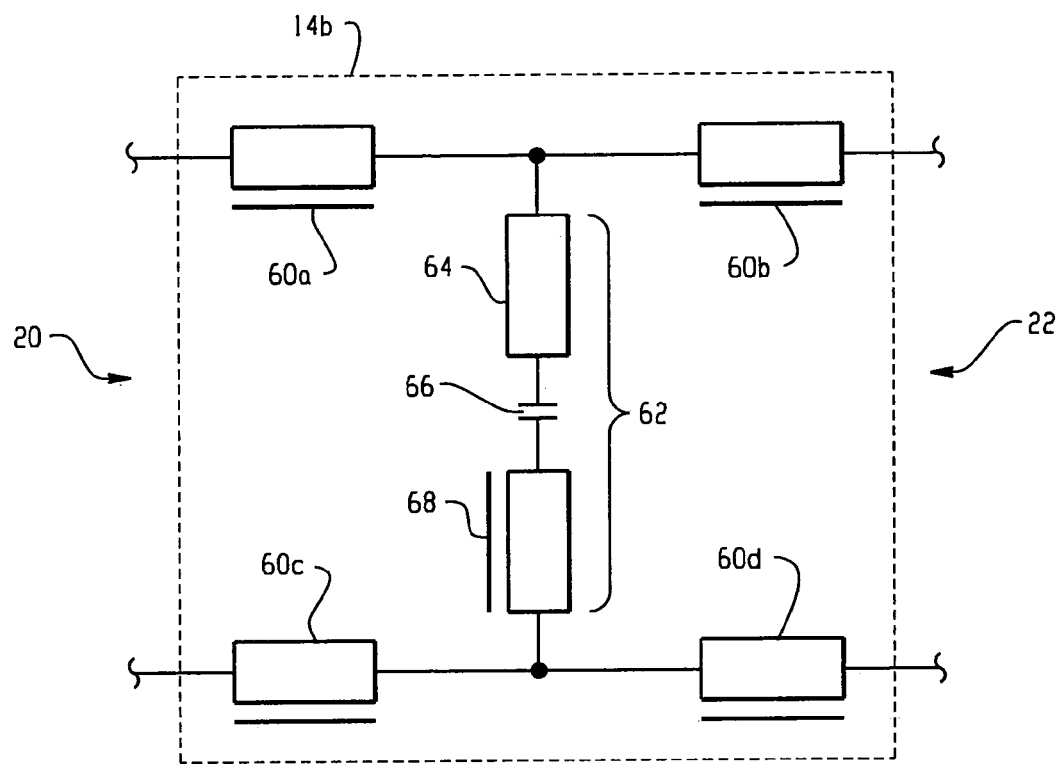
FIG. 4 illustrates an embodiment of a passive power conditioner circuit in greater detail in accordance with the concepts of the present application.

Turning to FIG. 4, depicted is a more detailed illustration of a passive damping circuit 62, in accordance with the present application, which will achieve the damping curve 48 of FIG. 3. This circuit also illustrates how power conditioner 14b may be obtained without the use of a series damping resistor. Particularly, in this configuration, passive power conditioner 14b is designed to incorporate a plurality of differential mode inductors 60a, 60b, 60c and 60d, as the passive reactance components illustrated in FIGS. 1 and 2. In this embodiment, an adequate passive damping circuit 62 (i.e, such as one described as passive damping circuit 18 and/or 18' of FIGS. 1 and 2) is connected between the differential mode inductors 60a–60d. The adequate passive damping circuit 62 incorporates in this embodiment, a resistor 64, capacitor 66 and inductor 68. The adequate passive damping circuit 62 and differential mode inductors 60a–60d have adequate magnitude to work in concert to provide adequate damping by way of amplifying and/or attenuating at a single selected frequency or multiple selected frequencies. The components of the adequate damping circuit 62 will also work in concert with a single adjustable terminator or multiple adjustable terminators (not shown) of a two-wire process network. It is to be noted that adequate passive damping circuit 62 is not required to have the specific passive components illustrated in this figure. Rather, passive damping circuit 62 may omit one or more specific component types, if beneficial for particular implementation. In one example, the inductor 68, as will be described in following sections, may be omitted from the damping circuit 62. Still further, it is to be noted that in particular implementations, additional protection components, for example noise filter capacitors, may have an effect on the characteristics of the circuit, and therefore the component values may be adjusted to accommodate the additional protection circuitry.

Figure 5:
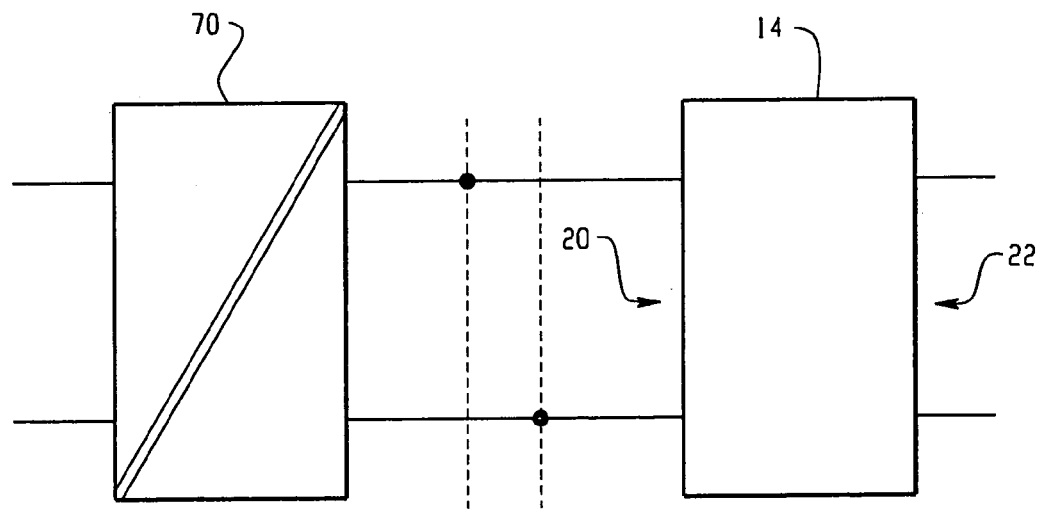
FIG. 5 illustrates the interconnection of a passive power conditioner circuit to a power supply in accordance with the present application.

Turning to FIG. 5, set forth is an illustration of a passive power conditioner 14 (or any one of the previously described or to be described passive power conditioners) which may be connected to either a single (i.e., simplex) or redundant bulk power supply 70.

Figure 6:
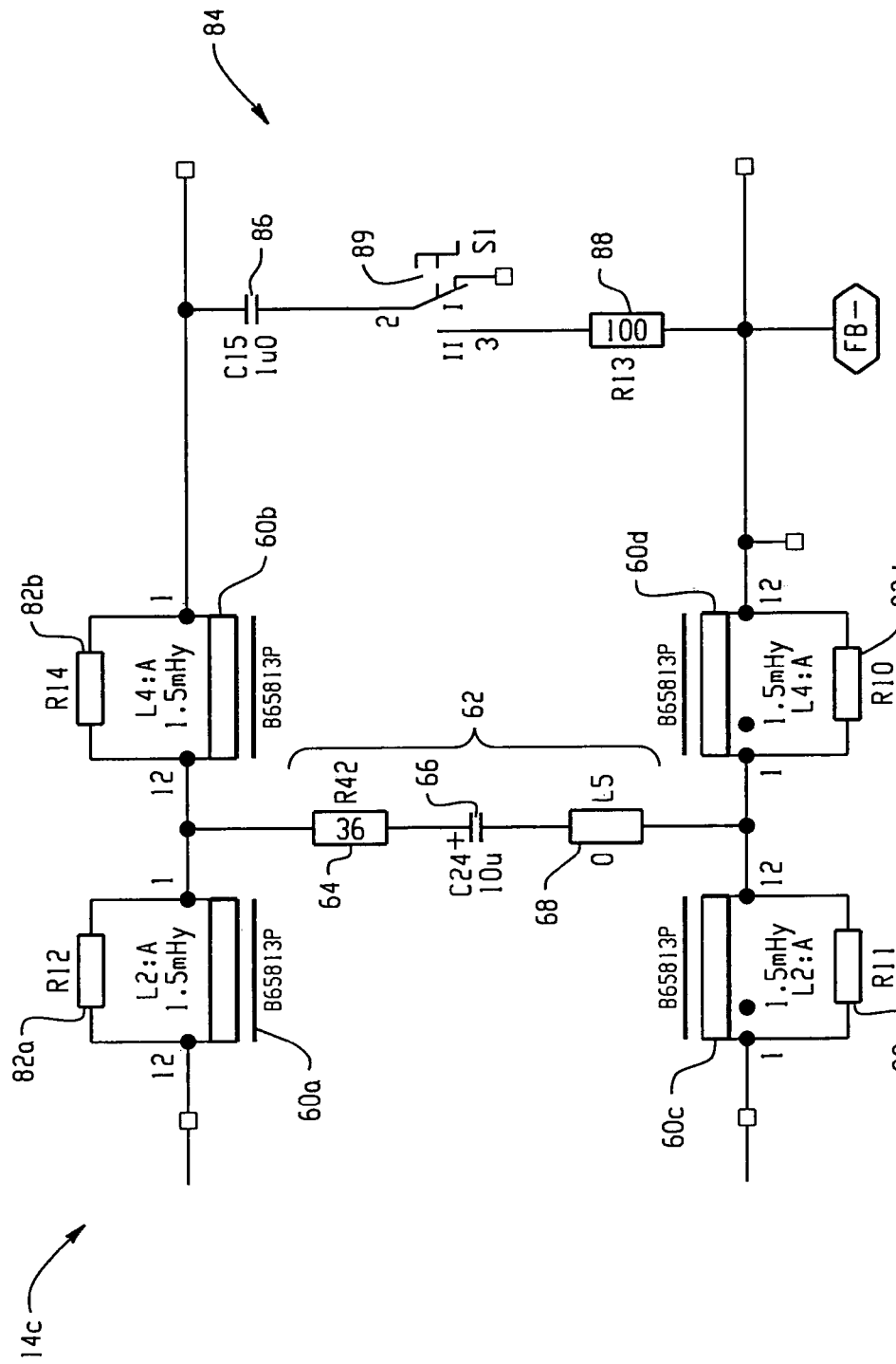
FIG. 6 illustrates a more detailed view of a passive power conditioner solution according to the present application illustrating specific damping circuit and AC symmetry.

Turning to FIG. 6, illustrated is a simulated passive power conditioner 14c with certain component values, which are not to be interpreted to be limiting of concepts of this application. In this example, the reactance and specific damping AC symmetry can clearly be seen. The conditioner 14c works by increasing the amount of the low frequency component by reducing the high pass cut-off point, as well as maintaining an adequately low resonance level at the cut-off point, through strategic placement of passive damping circuit 62 in relation to inductors 60a–60d. In this example, resistor 64 is 36 ohms, capacitor 66 is 10 μF, inductor 68 is 560 μH, and each of inductors 60a–60d is rated at 1.5 mH. It is to be understood, these values are not intended to be limiting to the concepts set forth herein. In addition, not shown in conditioner 14b, are resistors 82a–82d used to shunt some or all inductors 60a–60d. It is to be understood that while resistors 82a–82d are shown in this design, other passive components or combinations of passive components may be used to shunt some or all of the inductors 60a–60d. Further, the passive damping network 62 may also be comprised of one or more capacitors and/or resistors and/or inductors positioned or arranged in any combination. By specific example, and as will be expanded upon in a following discussion, inductor 68 is optional. Also shown in this figure is switchable terminator 84 which in this embodiment consists of capacitor 86, resistor 88 and switch 89 and which may be implemented in any of the described embodiments.

The above discussion has set forth embodiments teaching that damped passive power conditioners which can substantially eliminate the need for a significant amount of in-series damping resistance. Removal of the in-series resistance permits for an improved operational range of two-wire networks employing such passive conditioners. However, another issue in existing two-wire networks is the existence of cross-talk and other forms of interference between segments or trunks of two-wire networks which employ non-isolated passive power conditioning. Attention will now be more particularly directed to this issue as it relates to passive power conditioners.

FIG. 7 illustrates a two-wire network circuit 90, where adequate impedance from a low impedance power source 92 is provided, by use of a differential mode inductor 94. The two-wire network, segment or trunk 96 includes terminators 98a, 98b. The differential mode inductor circuit 94 may also include additional localized components to curtail network resonance in network 96, and may comprise differing formats. However, for the purpose of this description, it is described and illustrated as simply a differential mode inductor.

A distinction between the illustrated circuit 90 and a circuit for a conventional two-wire network, is the inclusion of common mode inductor circuit 100. The common mode inductor circuit 100 may comprise, or be substituted by, discrete inductors or components, which perform the same or a similar function. For purposes of this description, the common mode inductor circuit 100 is described and illustrated as simply a common mode inductor. The common mode inductor 100 may also include additional localized components to curtail network resonance. For example, each winding may be shunted and/or partially shunted, by one or more resistors and/or one or more capacitors and/or one or more inductors, arranged in any combination. Alternatively, the two windings may be connected, upstream and/or downstream and/or at any point between, by one or more resistors, capacitors and inductors, or any combination thereof. Corrections for component tolerance will not be required for this description although they may be required for practical application.

The function of the common mode inductor 100 will become more apparent when analyzing the AC model of FIG. 11, however, to realize the model, a description of the factors that contribute to the rationale for the model will first be described by way of example and attention to FIGS. 8–10, which emphasize situations which will cause an unbalanced network having more than a single segment. The AC model of FIG. 11 will expand on the concepts of an unbalanced network and its consequence.

As shown by FIGS. 8–10, there may be many contributors to network unbalance. FIG. 8 illustrates segments or trunks 110a to 10n (segment 10n may represent two or more segments or trunks), which have some capacitive inter-segment coupling with resulting capacitive unbalance 112. The inter-segment capacitive coupling, and resulting capacitive unbalance 112 created in this instance, may be attributed to a variety of factors including but not limited to cable manufacturing irregularities.

FIG. 9 illustrates segments or trunks 110a to 110n coupling to ground (E) 114 with resulting capacitive unbalance 116a to 116n. Segment to ground capacitive coupling, and the resulting capacitive unbalance 116a to 116n, may be attributed to a variety of factors including but not limited to any one or combination of cable processing device or processing device coupler irregularities. This type of unbalance is similar, in at least one respect, to the unbalance illustrated in FIG. 8.

FIG. 10 illustrates an unbalance between segments or trunks 110a to 110n caused by multiple ground (E) faults 118a to 118n, where a fault may comprise any one or combination of a resistance, inductance, capacitance or conductance which may occur, for example, when cable terminals may be partially submerged in sea water.

As depicted in FIGS. 8, 9 and 10, unbalances or faults within a network may occur from any conductor to any other conductor or from either conductor to ground. Other parasitic factors may also be present but for the purpose of this description, they are not now considered. The result of any unbalance may cause parasitic crosstalk between two or more segments. Therefore, to curtail the parasitic influence it is recommended that galvanic isolated power supplies be used for each segment however, as described previously, ideal galvanic isolation may not be attained in the present environment.

Now, and as previously mentioned, use of an AC model representing a Fieldbus network is useful in understanding the function of the common mode inductor, as well as the concepts of an unbalanced network and its consequence as it relates to unbalanced segments and faults, which may cause communication problems. It is to be understood, however, that reference to use with a Fieldbus network is not intended to be limited only thereto, but is applicable to all relevant networks. Turning to FIG. 11, an AC model 120 (for a circuit similar to that of FIG. 7, but for multiple segments), will now be described by way of example where, for generic applicability, identical segments 110a and 110n are both connected to power supply 92. For this discussion, segments (110a and 110n) may be connected to one common single (simplex) power supply or one common redundant power supply, or each segment 110a and 110n may be connected to one discrete single (simplex) power supply or one discrete redundant power supply.

The system may comprise two or more segments 110a to 110n (where segment 110n considered is one or more segments) attached to common points 122a and 122b, with the previously described orthogonal inter-segmental coupling 112 and 112a (where 112a represents such coupling among additional segments or trunks of the Fieldbus network). For the following description, only segments 110a and 110n are considered.

The power supply filter capacitance 124a to 124n, for discrete single (simplex) power supplies or discrete redundant power supplies, are coupled to ground (E) 114 to provide effective interference reduction. For discrete redundant power supplies, total filter capacitance 124a or 124n is found by the summation of each power supply's capacitance. For example, if segment 110a comprises a galvanic redundant (e.g., two) power supply with each supply having a two nano-Farad bypass filter capacitor, then the total capacitance 124a in segment 110n will be four nano-Farads. Ground (E) path impedance 126 may tend towards zero ohms for discrete power supply topologies, or may equal the summed filter capacitance of the common power supply topology. Further, ground E path impedance 126 may be any one or combination of capacitance, inductance or resistance, and may also be the result of many factors for example, a common power supply may have its negative rail connected to ground (E) 114. The filter capacitance 124a to 124n will tend towards zero ohms for the common power supply topology.

The unbalanced impedance 116a–116n to ground (E) 114 will tend towards zero ohms for multiple ground E short circuits. The cable-to-cable unbalance impedance 112 will tend towards zero ohms for conductor-to-conductor short circuits. Unbalanced impedance 116a–116n and 112 may be comprised from any one or combination of capacitive, inductive, resistive or conductive components.

Figure 11:
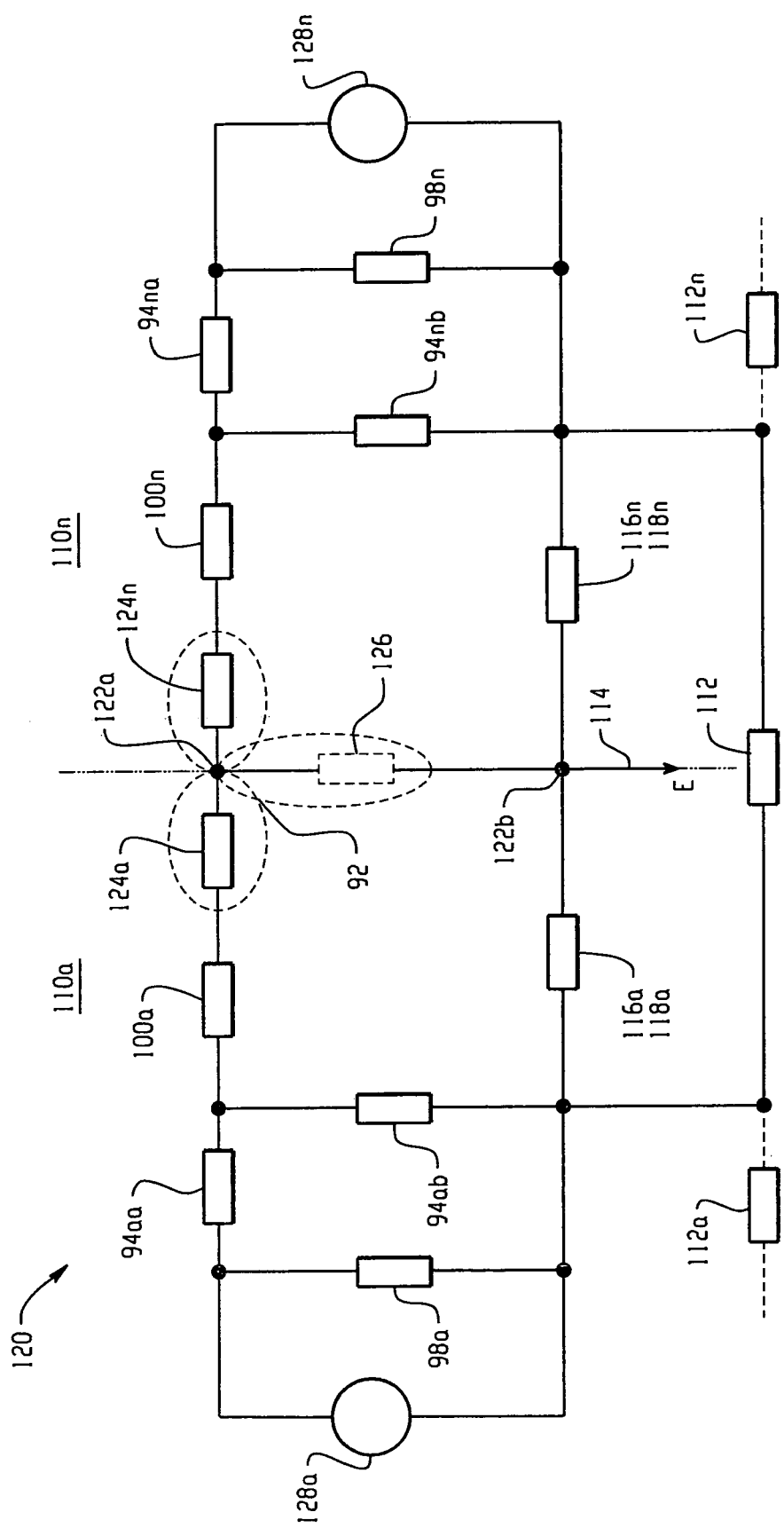
FIG. 11 is an AC model of multiple segments in a Fieldbus network.

With continuing reference to FIG. 11, a differential mode inductor circuit (such as 94 of FIG. 7) is defined in each segment (110a, 110n) of the AC model 120, as components 94aa and 94ab on segment 110a and components 94na and 94nb on segment 110n. For the AC model 120, these components are shown formed as a Pi filter with resultant mutual attenuation between segment 110a and segment 110n, where an attenuation magnitude is proportionally dependant or partly proportionally dependant upon at least one of or a combination of terminators 98a and/or 98b, common mode inductors 100a and 100n, Ground (E) path impedance 126, fault unbalances 112c and/or 116a and/or 116n, or the filter capacitors 124a and/or 124n.

Mutual attenuation resulting from component impedance will also be proportionally dependant or partly proportionally dependant upon the harmonic content or frequency of telemetry passing between segment 110a and segment 110n.

The present discussion has noted that the omission of segment galvanic isolation, would effectively substitute the filter capacitors 124a–124n with a zero impedance path. At this juncture, it is noted that under conditions where of the common mode inductors 100a and 100n are omitted, with ground E path impedance 126 set to infinity ohms, and an imbalance which sets faults 116a to 116n to a zero ohm resistive fault, for example, one conductor on each segment 110a and 110n will be in short circuit to ground E 114. This situation would result in excessive cross talk between segment 110a and segment 110n, causing telemetry distortion and, ultimately, communication failure. Taking the ground E impedance 126 down towards zero ohms will curtail the crosstalk but only where ground E faults 118a and 118n and/or capacitive unbalance 116a and/or 116n occurs, and not where conductor-to-conductor faults or capacitive unbalance 112 occur in isolation. Nevertheless, ground E impedance 126 will proportionally affect the impedance of each power conditioner, to a point where for a Fieldbus network the impedance constraints outlined within IEC61158-2 clause 12 are breached.

It may be noted at this point that an original draft specification SP50 related to Fieldbus standards allowed power conditioners to be grounded. In this case, it is apparent that, for a conventional power conditioner arrangement, a conductor to ground fault would instantly divide the impedance by two underworst-case conditions. Therefore, grounding the power conditioner is not recommended unless there is suitable intersecting impedance available, for example, the impedance provided by common mode inductors 100a, 100n. This also applies, in part, to grounded terminators. On the other hand, ground E impedance 126, may be designed and utilized, in conjunction with the common mode inductors 100a, 100n if required, to provide, or assist in obtaining, adequate attenuation and/or adequate impedance under the imbalance and/or fault conditions. Alternatively, such a design may provide non-specific segment injection utilities and/or segment reception utilities. Such ground E impedance 126 may be comprised of one or more resistors and/or one or more capacitors and/or one or more inductors, arranged in any combination.

Components and/or circuits 100a, 124a, 126, 124n, 100n, 116a, 116n, 112 and 94ab or 94nb will, in combination, affect the resultant impedance of 94nb or 94ab respectively. Therefore, components should be sized in view of maintaining adequate segment impedance with one or more combinational faults.

It is now recalled that the critical damping resistance of 50 ohm, which in conventional passive conditioner designs is placed in series with a differential mode inductor is not being used herein. Since the main benefit of the 50 ohm resistor is for critical damping of second order resonance, it is not now necessary in the described circuit for use in isolation or for passive power conditioning.

It can now be observed how cross talk may occur from one segment (e.g., 110a) to the other segment (e.g., 110n). Particularly, device 128a may be in a transmit mode, and device 128n may be in a receive mode, whereby the receive amplitude will be subject to the attenuated magnitude. Up to a certain level, crosstalk, at an attenuated magnitude, may be tolerated (the level will be dependant on the particulars of the system). Beyond that point, attempts to communication to the receive device 128n on segment 110n will result in a communication failure due to excessive telemetry distortion. Alternatively, the receive device 128n on segment 110n may successfully, but undesirably, receive data from the transmitting device 128a on segment 110a.

Many systems that are currently available utilize some form of segment isolation, where components equivalent to filter capacitors 124a to 124n offer adequate crosstalk attenuation. These systems do not, however, offer common mode inductor attenuation or at least attenuation adequate to curtail crosstalk where the common mode inductors are considered in isolation. In existing systems common mode inductors are at times utilized to curtail high frequency interference, but are used in conjunction with the in-band frequencies of interest for this use, and they are generally only used to filter out noise generated by the switching circuits of switch mode power supply converters or isolators. On the other hand, the common mode inductor(s) 100 (100a, 100n) of the present application are designed and utilized herein to provide adequate impedance to curtail inter-segmental 110a to 110n cross talk to an acceptable level and/or to provide adequate impedance within the segments, under fault conditions, where other isolation (e.g., galvanic isolation) techniques between segments do not need to be utilized.

For example, and with reference to the AC model 120 of FIG. 11, the above situation may exist when filter capacitor impedances 124a to 124n tend towards zero ohms and the ground E impedance 126 is maintained at an acceptably high impedance such that the combination of all downstream components are favourable to adequate segment (110a, 110n) impedance even with a direct short circuit fault. To further describe the benefits of such impedance, it may be considered that capacitive unbalance 112 may be replaced by a shorting wire, and that cross talk from one segment (110a) to another (110n) is attenuated to an adequately low level even with the shorting wire. The adequately low level may be applicable with one terminator 98 (98a, 98n) deficit from one or more segments 110a to 110n.

It may be understood that a point of similarity between the common power supply topology 92 with a common mode inductor 100 (100a–100n) and a discretely isolated power supply topology 92 without a common mode inductor 100 (100a–100n) is that with an adequate inductance, the impedance of the common mode inductor 100 (100a–100n) will equal the impedance of the filter capacitors (124a, 124n), ignoring, at this point, ground E impedance 126, at a given frequency.

Therefore, above the given frequency, the impedance of the common mode inductor 100 (100a–100n) will surpass the impedance of the filter capacitors 124a, 124n whereby high frequency interference suppression or attenuation on misbalanced segments 110a and/or 100n will be improved. Realizing the ground E impedance 126, in shunt topology, will assist in further cross talk attenuation, where components are selected not to significantly influence the power conditioner impedance under the above conditions. Of course, common power supply topology 92, ground E impedance 126, will only procure attenuation through ground E faults 116a and/or 118a and/or 116n and/or 118n.

The common mode inductor 100 (100a–100n) will possess lower impedance below the given frequency. However, lower frequency induction and/or cross talk requires comparably higher energy levels and/or longer exposed lengths of cable core. Nevertheless, for Fieldbus network implementations, provided that the cross talk amplitude of the lower frequency follows the frequency toleration constraints outlined within IEC61158-2 clause 12, then communication failure will not occur. This frequency toleration constraint forms a curve that the common mode inductor 100 (100a–100n) will follow quite closely, as the attenuation order of the common mode inductor 100 (100a–100n) will result in an attenuation of six decibels per octave or twenty decibels per decade.

For many common mode inductors of a given size, magnetic saturation can occur at very low levels of current unbalance or current differentials created by faults such as differing segment ground faults. Common mode inductors work most effectively where the current in each winding is equal and opposite and they are often referred to as current compensated chokes or Balun coils. Multiple ground faults are typically found, or occur, around each spur or process device in a Fieldbus network, and can unbalance the current in each common mode inductor such that progressive saturation will progressively render the function of the common mode inductor ineffective or inadequate in curtailing parasitic crosstalk.

Figure 12:
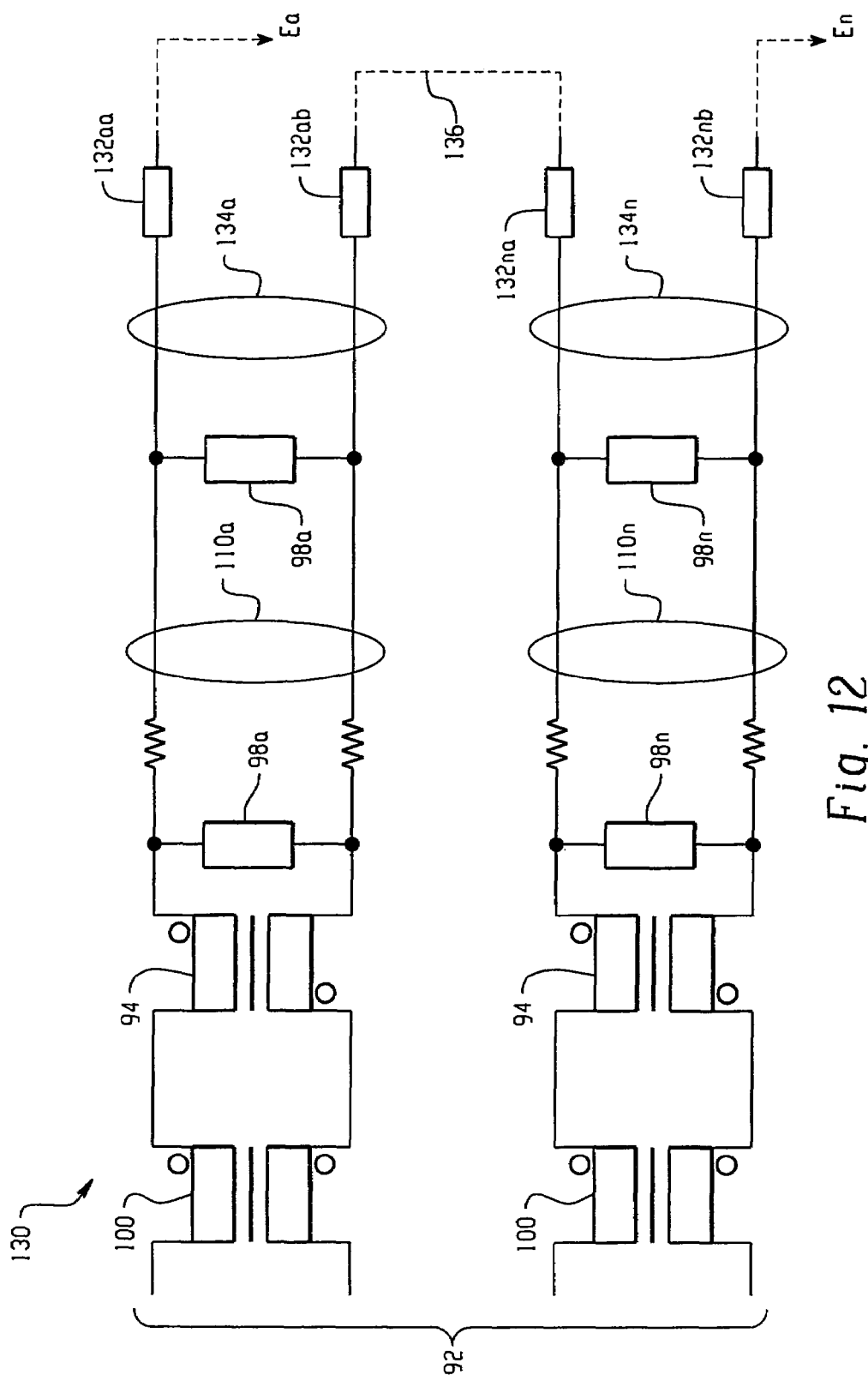
FIG. 12 illustrates a Fieldbus network with balanced non-linear current limiters (or linear current sensing)

Measures can be taken to prevent ground faults and these may comprise insulated covers for exposed wire connectors or even a simple plug and socket arrangement such that removal of a wire or wires will not make contact to ground. Other measures may comprise annunciation of a single, but tolerable, ground fault such that this can be effectively cleared before further ground faults, and consequential common mode inductor saturation, occurs. However, a further embodiment of the disclosed concepts may comprise, in addition to these measures, a less obvious technique of providing a balanced spur short circuit current limit for each conductor of each spur. This alternative multi-segment circuit configuration 130 is shown in FIG. 12, which illustrates balanced non-linear current limiters, or non linear current limit circuit sensing, 132aa to 132nb positioned in each conductor such that any spur 134a to 134n with a fault of any conductor to ground Ea to En or any cross spur fault 136 from any conductor on one spur 134a to any conductor on another spur 134n will not, for segments 110a to 110n that share the same power source 92, permit current unbalance through each participating common mode inductors 100a–100n to reach a level that would render the function of the common mode inductors 100a–100n ineffective or inadequate in curtailing parasitic crosstalk between segments 100a–100n. Of course, each segment 110a–110n may comprise one or more spurs or splices 134a or 134n (although only one is shown in each segment of this figure) each with, or without current limit sensing 132aa to 132nb as required.

Figure 13:
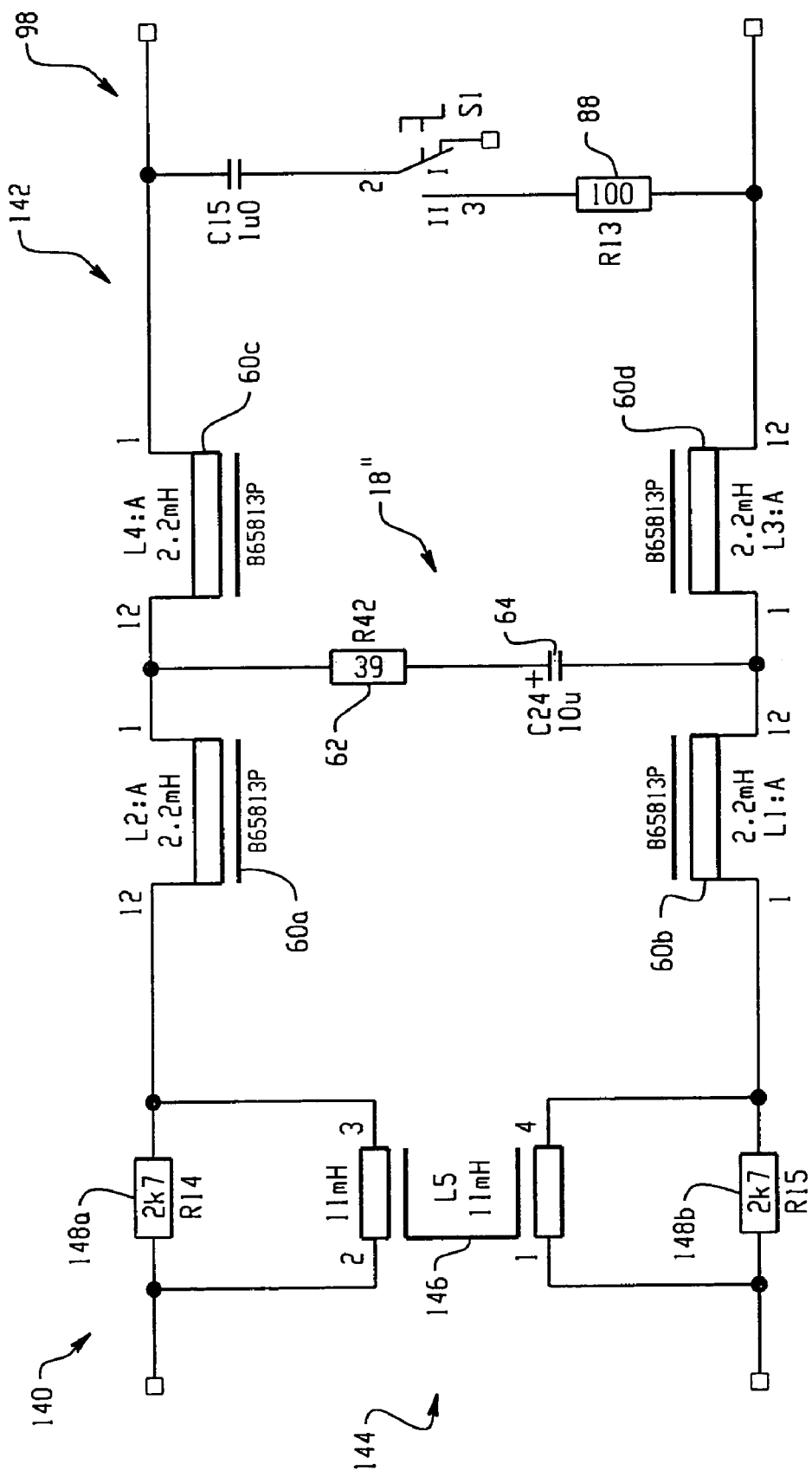
FIG. 13 illustrates a practical example of a passive power condition and pseudo-isolation or common mode inductor combination circuit.

FIG. 13 illustrates a practical circuit 140, implementing the power conditioner and pseudo isolation (i.e., common mode inductor) concepts which have been described above in combination circuit.

With specific attention to circuit 140, provided is a passive power conditioning section 142 similar to previous embodiments, and pseudo isolation portion 144. Circuit 140 also includes the previously recited terminator 98. In this design, inductors 60a-60d are maintained (however, their values are now each 2.2 mH). The passive damping network is defined somewhat differently from previous embodiments. Particularly, passive damping network 18" includes resistor 62 (39 ohm), and capacitor 64 (10 μF). However, the previously used inductor 66 is not incorporated within the passive damping network 18". As mentioned, the inductor of previous embodiments is now no longer incorporated directly in the passive power conditioner network. Additionally, in this embodiment, bypass components such as resistors, capacitors, inductors or combinations thereof are also not shown. It is to be appreciated however, that variants of this circuit may include such bypass components.

Turning attention to the pseudo isolation circuitry 144, an inductor 146, is connected across resistors 148a and 148b, where the inductor is an 11 mH inductor and the resistors are each defined as 2.7K ohm resistors. As previously described, the operation of pseudo isolator 144, impedes differential signals (DC or AC). It however is configured to permit common mode signals. Therefore, in this design, in a balanced network, input signals would flow in and output signals would flow out in a normal manner. However, if the circuit entered an unbalanced state, inductor 146 lowers its efficiencies and acts to block the unbalanced signal portions.

Thus, the imbalance of the currents within the network causes a decrease in the efficiencies of inductor 146, thereby allowing undesirable interfering current flow. Thus, this design of the pseudo isolation 144 functions to limit crosstalk caused by faults such as described in FIGS. 8–10. By this design, the communication on the particular segment is not affected, but crosstalk from other segments are blocked or otherwise attenuated.

Figure 14:
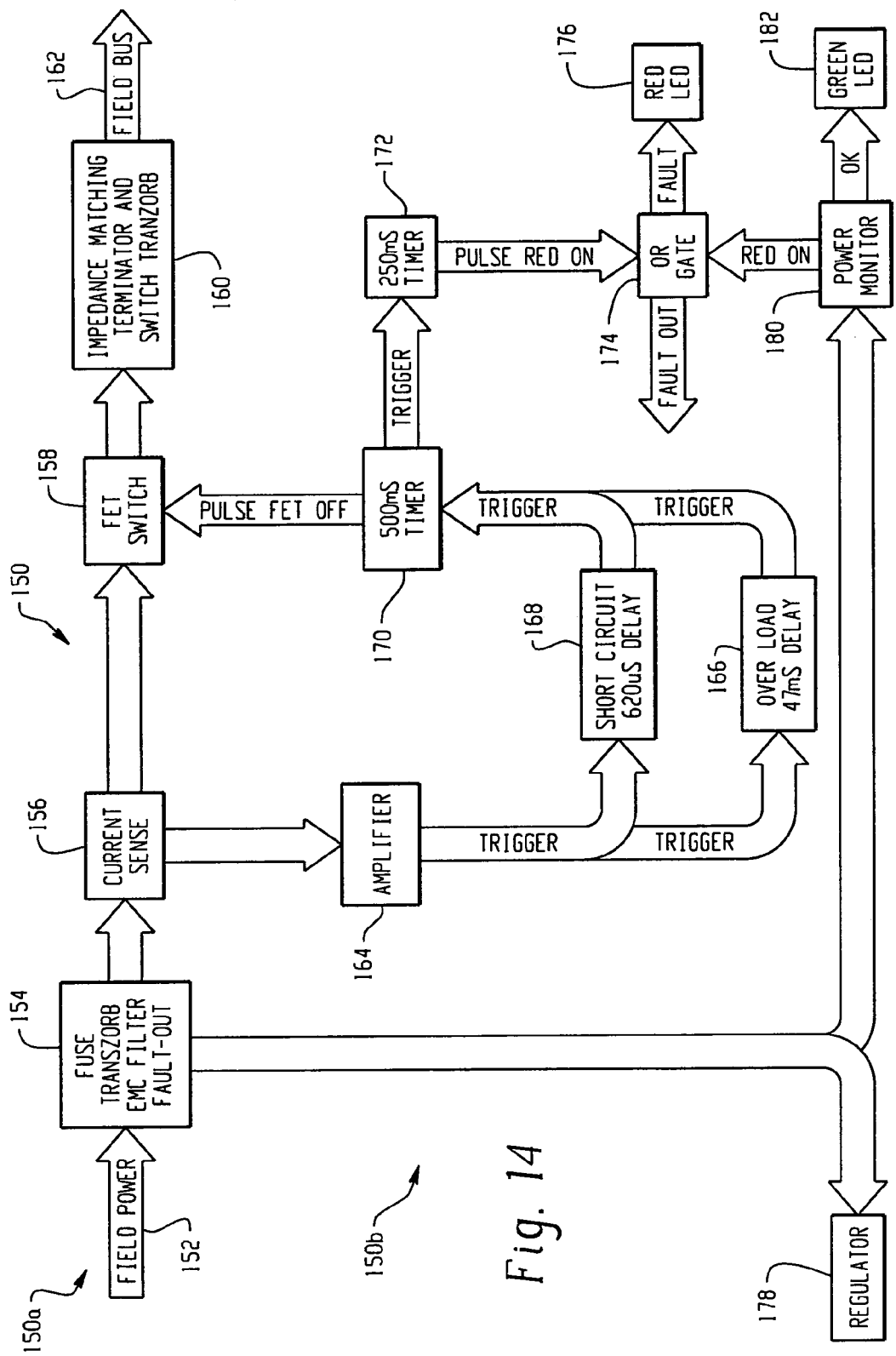
FIG. 14 depicts a block diagram flow for a passive power conditioner circuit and associated control mechanisms.

Turning now to a particular implementation, FIG. 14 represents a flow block diagram of a system which incorporates the passive power conditioner concepts which have been described above.

More specifically, FIG. 14 illustrates a logic and power flow sequence representing the occurrence of events in a Fieldbus segment and associated control circuitry, implementing the passive power conditioner concepts of the present application. Initially, field power 152 is provided to circuit 150, which is shown as having a conditioner segment section 150a and a control section 150b. A Front-end Circuit block 154 receives the input and performs common circuit filtering type operations. The front-end circuit block includes components such as: fuses, transzorbs, EMC filters and fault output circuitry to control and otherwise provide circuit protection. The output from block 154 is provided to a Current Sensing block 156, which senses circuit current being passed in segment portion 150a and generates a voltage proportional to said current for the amplifier 164. The majority of the output current continues on to the FET Switch block 158, wherein when the FET Switch block 158 is on, field power is passed to the Impedance Matching, Terminator Switch and Transzorber block 160. This block will include the previously noted passive power conditioner as well as the terminator for the Fieldbus segment, which have been described in previous sections of this application. Thereafter, the power is provided to the processing devices connected to the Fieldbus connector 162.

Turning to the circuit control section 150b, an Amplifier block 164 receives input from Current Sense block 156, for monitoring of circuit current flow to determine whether the processing devices supplied via connector 162 are operating properly, are in an overloaded state, or in a short circuit state. Outputs from the Amplifier block 164 are provided to the Overload threshold and Time Delay block 166, which is triggered by output from Amplifier block 164. When the threshold is exceeded and the set time delay fulfilled (e.g., 47 mS), the Time Delay block 166 sends a signal issued to Timer block 170, which generates a signal to turn off the FET Switch block 158. Thereafter, once the Timer block 170 has completed its cycle (e.g., 500 mS), the FET Switch 158 is turned back on. In this instance, Timer block 170 issues the turn-on signal of FET Switch block 158 after 500 mS.

In a short circuit situation, Amplifier block 164 generates a signal to trigger Short Circuit threshold and Time Delay block 168 which in turn sends a trigger signal to Timer block 170 after 620 uS, which undertakes the same turning off of FET Switch block 158 and thereafter, once the Timer block 170 has timed out, FET Switch block 158 is turned back on. In proper operation, Timer block 170 will also issue a trigger signal to a second Timer block 172 (a 250 mS), which issues a signal to Or Gate block 174, resulting in a fault signal to the Red LED block 176. Or Gate block 174 also issues a Fault-Out signal to block 154 at the same time it is powering the signal for the Red LED operation. In this instance, since the LED will receive signals both when there is a short circuit and an overload intelligence provided to the Or Gate block 176, it is possible to flash the Red LED to indicate a status of the circuit (e.g., excessive current).

Regulator block 178 provides the voltage regulation for the control circuit section 150b. Power Monitor block 180 monitors the input voltage (field power) 152. If the input voltage falls below a set value, the green LED block 182 is turned off, and the Red LED block 176 is turned to a continuous on state indicating insufficient input voltage. Thus, there are two modes for Red LED block 176. The flashing mode, where flashing means excessive current, and a steady state indicating insufficient input voltage. Both modes will generate a Fault Output signal in block 154.

Figure 15A:
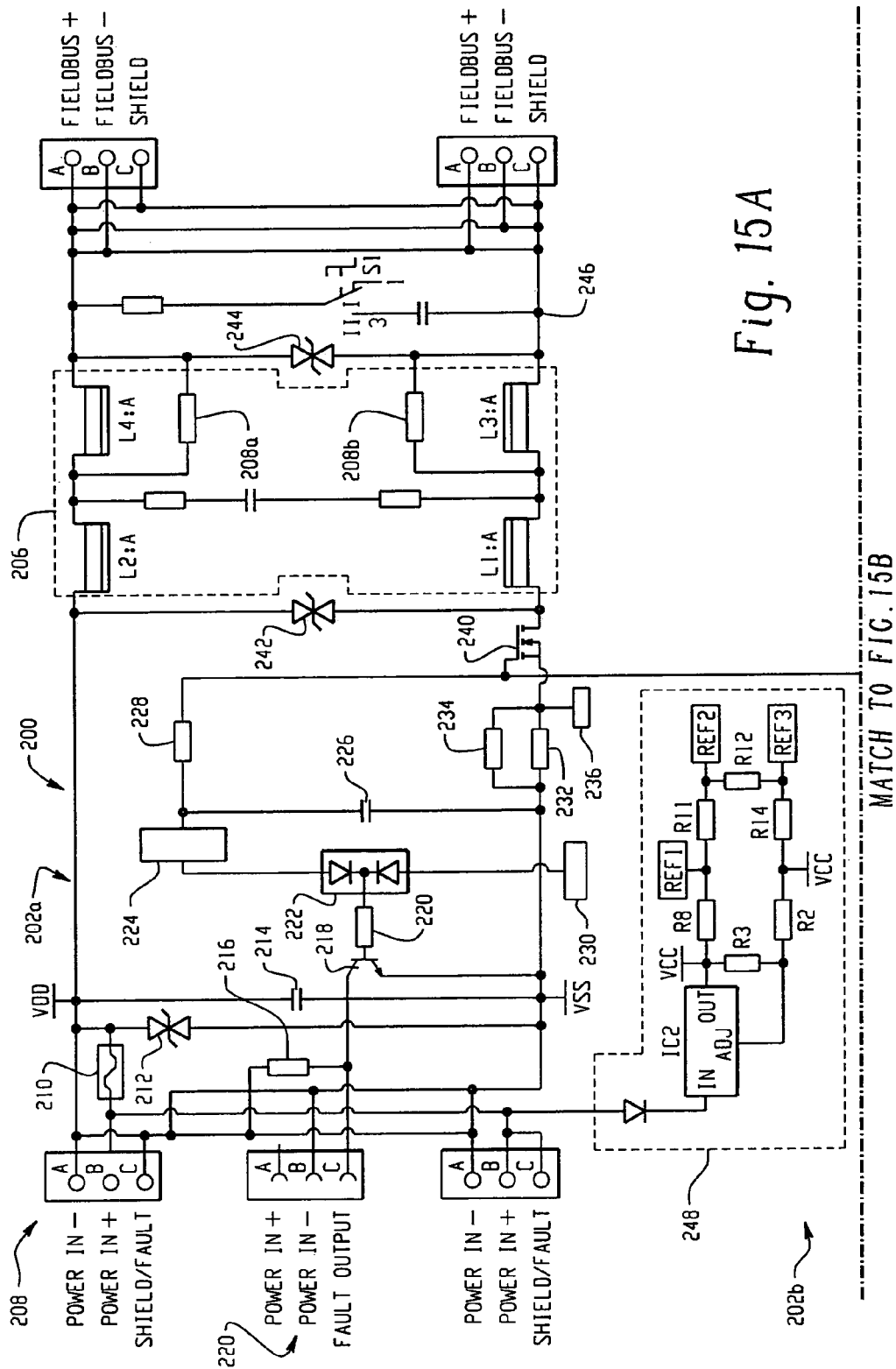
FIG. 15 illustrates a more detailed component diagram of the block diagram flow shown in FIG. 14.
Figure 15B:
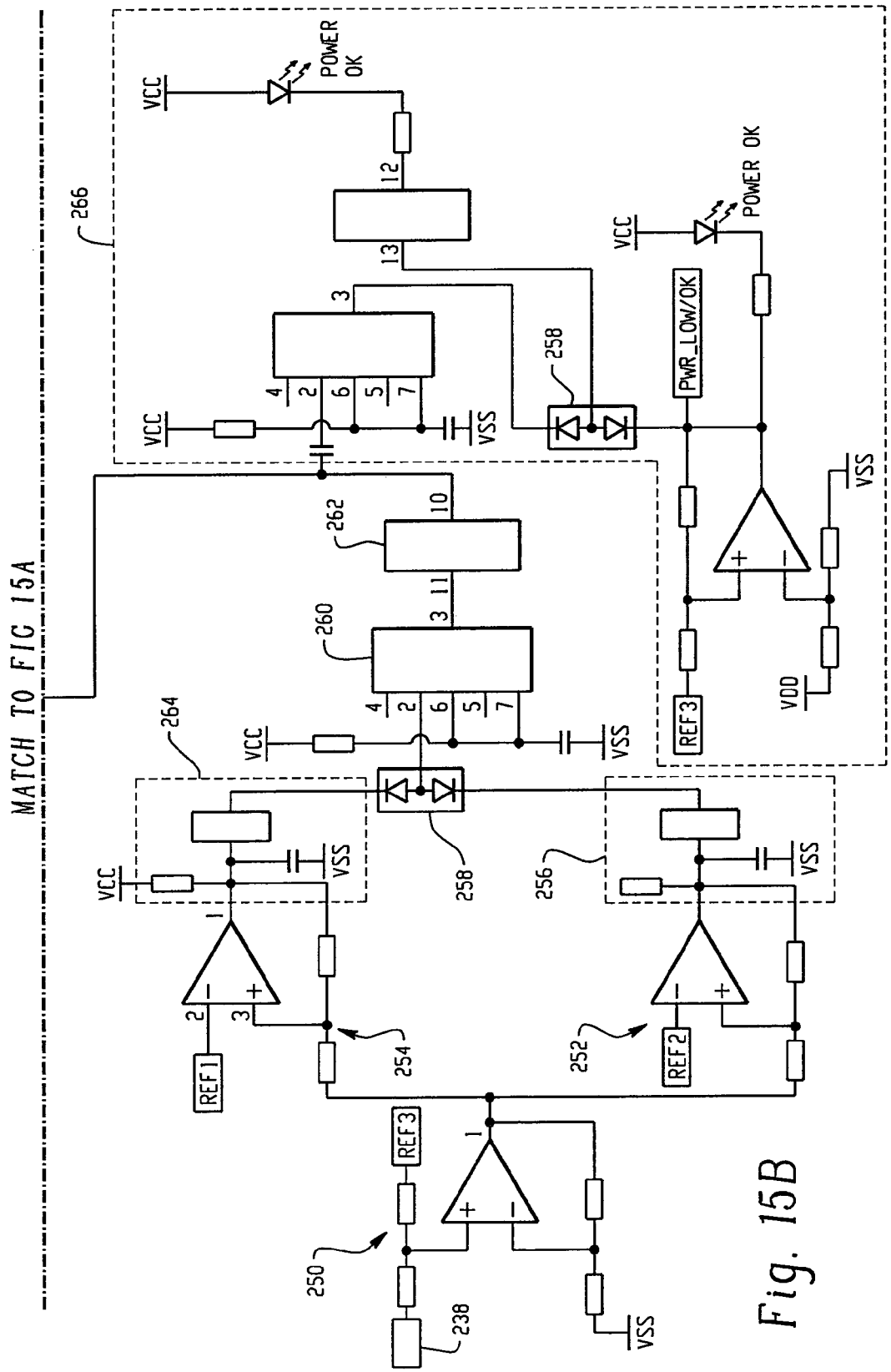

Turning to FIG. 15, set forth is a more detailed circuit 200, corresponding to the block flow diagram of FIG. 14. Similar to FIG. 14, the upper half 202a (150a in FIG. 14) of the circuit 200 represents the conditioner circuits and the lower half 202b (150b in FIG. 14) represents control circuits which control operation of a circuit 200. Of particular note, and as related to the present concepts, set forth is a passive power conditioner 206 (in block 160 of FIG. 14) of a type having been previously described. For example, this conditioner is substantially similar to the passive power conditioner shown in FIGS. 4 and 6. A distinction between these power conditioners is the use and placement of bypass components such as resistors 208a and 208b. In the previously cited embodiments of FIG. 4, no bypass components were implemented, and in FIG. 6, each inductor included a bypass component.

Additionally, while the passive power conditioner 206 of FIG. 15 is shown in this embodiment, it is to be appreciated that any of the embodiments and/or arrangements of the passive power conditioners previously described may also be used. For example, the passive power conditioner of FIG. 13 may be implemented in this circuit, thereby also gaining pseudo isolation between segments of a Fieldbus network.

With continuing attention to the segment portion 202a, when in operation power is input to the segment via input side 208. Fuse protection 210 is used to protect against a non-controllable short circuit and will act to disconnect the segment 202a from power input 208. Dual diode 212 provides over-voltage protection, and capacitor 214 performs noise filtering functions. Resistor 216 is a jumper for connection of transistor 218 to the upper and lower parts of junction blocks 220. Transistor 218 is a fault output device which sends signals to the process controller (such as computers or microcontrollers) to indicate a fault state, via excessive change of signal transmitted through resistor 220. Dual diode 222, conditioning chip 224, capacitor 226, and resistor 228 are used to provide further initial signal conditioning for the transistor 218. When a signal transition occurs, such as a low power state, the signal from transistor 218 changes state, issuing a signal identifying a problem in the circuit such as a low power state 230.

Resistors 232 and 234 are current sensing resistors configured to provide a voltage representing the output current at sense block 236. This signal is passed to the current sensing amplifier circuitry in the control circuit section 202b at block 238.

Switch 240, embodied as a transistor, is the bus switch and acts to turn the Fieldbus network on and off at selected times in conformance with control circuitry 202b. Additional over-voltage protection is obtained by dual diodes 242 and 244. Circuit 200 also includes a switchable terminator 246, which has been previously discussed. However, it may be worth noting at this point that switching terminator 246 is provided due to the requirement that a bus is required to have two terminators in a Fieldbus network. In some installations, both terminators may already exist, and therefore an additional terminator is not required. In this situation, the terminator is switched out of the circuit. However, in installations where only one or no terminators exist, this design provides a flexible alternative to meet the required terminator standards.

Turning to the control circuitry 202b, the diode in block 248 represents a reverse voltage protection circuit, which functions to protect the control circuitry 202b. Particularly, if circuit 200 is inappropriately connected, the reverse voltage protection diode will protect control circuitry from damage.

Returning attention to block 238 which receives the sensed current signal from block 236, the sensed current signal is provided to a voltage amplifier 250. The amplified sense current signal is then delivered to two voltage comparators 252 and 254, each having distinct reference voltages, provided by block 248, so that they will trigger at two different current levels. The comparator configuration of 252 is designed to detect an overload situation in circuit 200, whereas comparator configuration 254 is designed to detect a short circuit situation in circuit 200. Overload circuit comparator 252 issues a signal causing the activation of an overload timer 256 (e.g., a 47 millisecond timer). After timer 256 has expired, a signal is issued through dual diode 258 to timer controller 260 and turns on circuit 262, which issues a turn-off signal to switch 240. Once timer 260 times out (e.g., 500 mS) transistor 240 turns back on. In a short circuit situation, the short circuit comparator 254 issues a signal causing the activation of a short-circuit timer 264 (e.g., a 620 microsecond timer) causing a signal to be issued through dual diode 258 to timer controller 260 and turns on circuit 262, which issues a turn-off signal to switch 240. Then when timer 260 expires, switch 240 is turned back on.

Turning to signal indicator circuitry 266, a visible indicator is enabled as to the status of the circuit, such as whether a fault exists or a power is in an acceptable state or a low state as previously discussed in connection with FIG. 14.

It is to be understood that the use of the timers and control circuitry may be implementation driven. Particularly, in some instances, high current is permitted to flow in segment 202a. For example, in a multi-segment system having multiple spurs, splices (etc.), to support all of the processing devices, it may be necessary to permit high current flow through the system. However, such high current needs to be limited in its time period. As it is known that extended high current flow through the system may result in damage to the components. The circuitry provided in FIG. 15 shows one instance of how such protection is afforded as incorporated in the passive conditioner 206 of the present application. In this regard, it is also noted that the specification for Fieldbus operation requires a 120 percent of rated output current to be allowed to flow for no less than 20 milliseconds, and 180 percent of rated output current for no less than 500 microseconds.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. An isolator/power conditioner network implemented within a multi-segment two-wire processing network, each segment having a power input side and a processing device side, the isolator/power conditioner network comprising:

a power conditioner located on at least some of the segments at a position after the power input side, and configured to receive input power; and a transformerless isolator located on at least some of the segments, between the power input side and the power conditioner, and configured to provide at least one of segment impedance, cross-talk or high frequency interference attenuation.

2. The isolator/power conditioner network according to claim 1, wherein the power input side of each of the segments is supplied with one of an isolated or non-isolated common power supply.

3. The isolator/power conditioner network according to claim 1, wherein any unbalance in each of the segments is within constraints required by IEC 61158-2.

4. The isolator/power conditioner network according to claim 1, wherein portions of at least one segment of the segments is in at least one of resistive, capacitive or inductive contact to ground.

5. The isolator/power conditioner network according to claim 1, wherein portions of at least one segment of the segments is in at least one of resistive, capacitive or inductive contact to a portion of at least one other segment of the segments.

6. The isolator/power conditioner network according to claim 1, further configured to provide isolation when there is a deficit of a terminator in at least one segment of the two-wire processing system.

7. The isolator/power conditioner network according to claim 1, wherein the power conditioner includes:

a passive reactance network configured of one or more passive reactor components within the two-wire network to generate communication impedance for the two-wire process network; and a passive damping network configured of one or more passive damping components in operative connection with the passive reactance network, wherein the passive damping network curtails at least one of (i) resonance, (ii) signal bias, (iii) signal jitter, (iv) signal distortion or (v) fly-back resonance of the two-wire process network.

8. The isolator/power conditioner network according to claim 7, wherein a series resistance of the passive damping network is less than approximately 20 ohms.

9. The isolator/power conditioner network according to claim 1, further configured to operate with at least one of a common simplex power supply, a redundant galvanically isolated bulk power supply, a discrete simplex power supply, or a redundant galvanically isolated power supply.

10. The isolator/power conditioner network according to claim 1, wherein an impedance of the two-wire process network is between 40 ohms and 60 ohms within a frequency range of 3 kHz to 39 kHz.

11. The isolator/power conditioner network according to claim 1, wherein an impedance at resonance of the two-wire process network is less than 70 ohms.

12. The isolator/power conditioner network according to claim 1, wherein the isolator is a common-mode-reactor.

13. A power conditioner for use in a two-wire process network comprising:

a passive reactance network configured of one or more passive reactor components, within the two-wire network, to generate non-attenuating communication impedance for the two-wire process network; and a passive damping network configured of one or more passive damping components in operative connection with the passive reactance network, wherein the passive damping network curtails at least one of (i) resonance, (ii) signal bias (iii) signal jitter, (iv) signal distortion or (v) fly-back resonance of the two-wire process, network.

14. The power conditioner according to claim 13, wherein the passive reactance network is positioned in the two-wire process network in at least one of (i) a symmetrical or (ii) asymmetrical series passive reactance configuration.

15. The power conditioner according to claim 13, wherein the separate one or more passive reactor components are at least one of intersected or shunted by the passive damping network.

16. The power conditioner according to claim 13, wherein the one or more, separate reactors, which are at least one of intersected or shunted by the at least one or more passive damping networks, act separately, collectively or interactively to provide the curtailment in resonance of the two-wire process network.

17. The power conditioner of claim 13, further including at least a second or more, passive damping networks positioned to at least one of intersect or shunt one or more passive reactor components of the passive reactor network.

18. The power conditioner of claim 13, wherein a series resistance within the passive damping network is less than approximately 20 ohms.

19. The power conditioner of claim 13, wherein at least one of the passive reactance or passive damping networks provide at least one of common mode noise or cross-talk rejection.

20. The power conditioner of claim 13, further configured to operate with at least one of a common simplex power supply, a redundant galvanically isolated bulk power supply, a discrete simplex power supply, or a redundant galvanically isolated power supply.

21. The power conditioner according to claim 13, wherein an impedance of the two-wire process network is between 40 ohms and 60 ohms within a frequency range of 3 kHz to 39 kHz.

22. The power conditioner according to claim 13, wherein an impedance at resonance of the two-wire process network is below approximately 70 ohms.

23. A power conditioner for use in a two-wire process network comprising:
a passive reactance network configured of at least two passive reactor components, within the two-wire network, to generate non-attenuating communication impedance for the two-wire process network; and
a passive damping network configured of one or more passive damping components in a shunted connection with the passive reactance network, wherein the passive damping network curtails at least one of (i) resonance, (ii) signal bias (iii) signal jitter, (iv) signal distortion or (v) fly-back resonance of the two-wire process, network.

* * * * *